United States Patent
Tyler et al.

(10) Patent No.: US 7,155,692 B2
(45) Date of Patent: Dec. 26, 2006

(54) METHOD AND SYSTEM FOR PERFORMING TIMING ANALYSIS ON A CIRCUIT

(75) Inventors: Sean Tyler, Fort Collins, CO (US); Thomas A. Asprey, Boulder, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 242 days.

(21) Appl. No.: 10/932,452

(22) Filed: Sep. 1, 2004

(65) Prior Publication Data
US 2006/0048085 A1 Mar. 2, 2006

(51) Int. Cl.
*G06F 17/50* (2006.01)
(52) U.S. Cl. .......................................... 716/6
(58) Field of Classification Search .................. None
See application file for complete search history.

(56) References Cited

U.S. PATENT DOCUMENTS

| | | | | |
|---|---|---|---|---|
| 4,698,760 A * | 10/1987 | Lembach et al. | ............ | 716/6 |
| 5,461,576 A * | 10/1995 | Tsay et al. | ............ | 716/6 |
| 5,778,216 A * | 7/1998 | Venkatesh | ............ | 713/503 |
| 5,796,621 A * | 8/1998 | Dudley et al. | ............ | 716/6 |
| 6,484,298 B1 * | 11/2002 | Nag et al. | ............ | 716/6 |
| 6,487,705 B1 * | 11/2002 | Roethig et al. | ............ | 716/6 |
| 6,763,506 B1 * | 7/2004 | Betz et al. | ............ | 716/6 |
| 6,795,951 B1 * | 9/2004 | Hathaway et al. | ............ | 716/5 |
| 7,003,747 B1 * | 2/2006 | Zhou et al. | ............ | 716/6 |
| 7,036,100 B1 * | 4/2006 | Tyler et al. | ............ | 716/6 |
| 2004/0194044 A1 * | 9/2004 | Tanaka | ............ | 716/6 |
| 2005/0183051 A1 * | 8/2005 | Darsow et al. | ............ | 716/6 |

* cited by examiner

*Primary Examiner*—Leigh M. Garbowski

(57) ABSTRACT

A method and apparatus for analyzing a circuit are described herein. The circuit may comprise at least two nodes, wherein each of the nodes has timing requirements associated therewith. An embodiment of the method comprises receiving a failure time of first node, wherein the failure time represents the time within which a signal must arrive at the first node from the second node in order to avoid a timing violation of the circuit. The second node is upstream of the first node. A potential slack is determined for the first node based on the failure time of the first node, wherein the potential slack is equal to the failure time minus the sum of the target time and the delay between the first node and the second node. The analysis is terminated if the potential slack is less than a first predetermined value. The target slack at the first node is determined, wherein the target slack is equal to the timing requirement of the first node minus the sum of the timing requirement of the second node and the delay between the first node and the second node. The timing requirement of the first node may be changed or relaxed if the target slack is less than a second predetermined value.

20 Claims, 7 Drawing Sheets

FIG. 7 - PORT TARGETS

| PORT | A_OUT | B1_IN | B2_IN | B_OUT | C_IN | C_OUT | D_IN | E_IN | F_IN |
|---|---|---|---|---|---|---|---|---|---|
| TARGET | 10 | 40 | 35 | 50 | 30 | 5 | 60 | 10 | 20 |

FIG. 8 - PATH DELAYS

| DELAY PATH | DELAY 1 | DELAY 2 | DELAY 3 | DELAY 4 | DELAY 5 | DELAY 6 | DELAY 7 | DELAY 8 | DELAY 9 |
|---|---|---|---|---|---|---|---|---|---|
| DELAY | 15 | 10 | 25 | 10 | 5 | 60 | 10 | 5 | 10 |
| CYCLES | 0 | 0 | 0 | 0 | 0 | 2 | 0 | 0 | 0 |

FIG. 9 - LATEST ALLOWABLE SIGNAL TIME

| PORT | A_OUT | B1_IN | B2_IN | B_OUT | C_IN | C_OUT | D_IN | E_IN | F_IN |
|---|---|---|---|---|---|---|---|---|---|
| TARGET | 20 | 45 | 36 | 55 | 33 | 25 | 60 | 30 | 40 |

METHOD AND SYSTEM FOR PERFORMING TIMING ANALYSIS ON A CIRCUIT

BACKGROUND

Very large scale integration (VLSI) has been made possible by an ever improving technological ability to create complex electronic circuits. Efficient design of VLSI circuits requires some automatic means for designing the interconnection patterns and for designing the layout of the circuits. In this regard, there are a wide variety of products available in the art to assist in the design of VLSI circuits.

An integral part of all such design tools is a mechanism for evaluating the efficacy of the design. Timing analysis, such as static timing analysis, is one such tool for evaluating the efficacy of the design. In one embodiment of static timing analysis, a full chip or full circuit simulation is required in order to determine timing constraints or requirements for each of a plurality of design blocks. This embodiment typically requires excessive time to implement, which increases the difficulty for design evaluation. For example, a change in one block may affect another block. Accordingly, several revisions of the circuit may be required in order to achieve a properly working circuit. Due, in part, to the excessive time required for evaluation, the time required to design an integrated circuit is long.

SUMMARY

A method and apparatus for analyzing a circuit are described herein. The circuit may comprise at least two nodes, wherein each of the nodes has timing requirements associated therewith. An embodiment of the method comprises receiving a failure time of first node, wherein the failure time represents the time within which a signal must arrive at the first node from the second node in order to avoid a timing violation of the circuit. The second node is upstream of the first node. A potential slack is determined for the first node based on the failure time of the first node, wherein the potential slack is equal to the failure time minus the sum of the target time and the delay between the first node and the second node. The analysis is terminated if the potential slack is less than a first predetermined value. The target slack at the first node is determined, wherein the target slack is equal to the timing requirement of the first node minus the sum of the timing requirement of the second node and the delay between the first node and the second node. The timing requirement of the first node may be changed or relaxed if the target slack is less than a second predetermined value.

BRIEF DESCRIPTION OF THE DRAWINGS

FIG. 7 is a chart of exemplary timing targets at each port of the circuit of FIG. 5.

FIG. 8 is a chart of exemplary path delays of the circuit of FIG. 5.

FIG. 9 is a chart of exemplary latest allowable signal arrival time at each port of FIG. 5.

DETAILED DESCRIPTION

Figure 1:
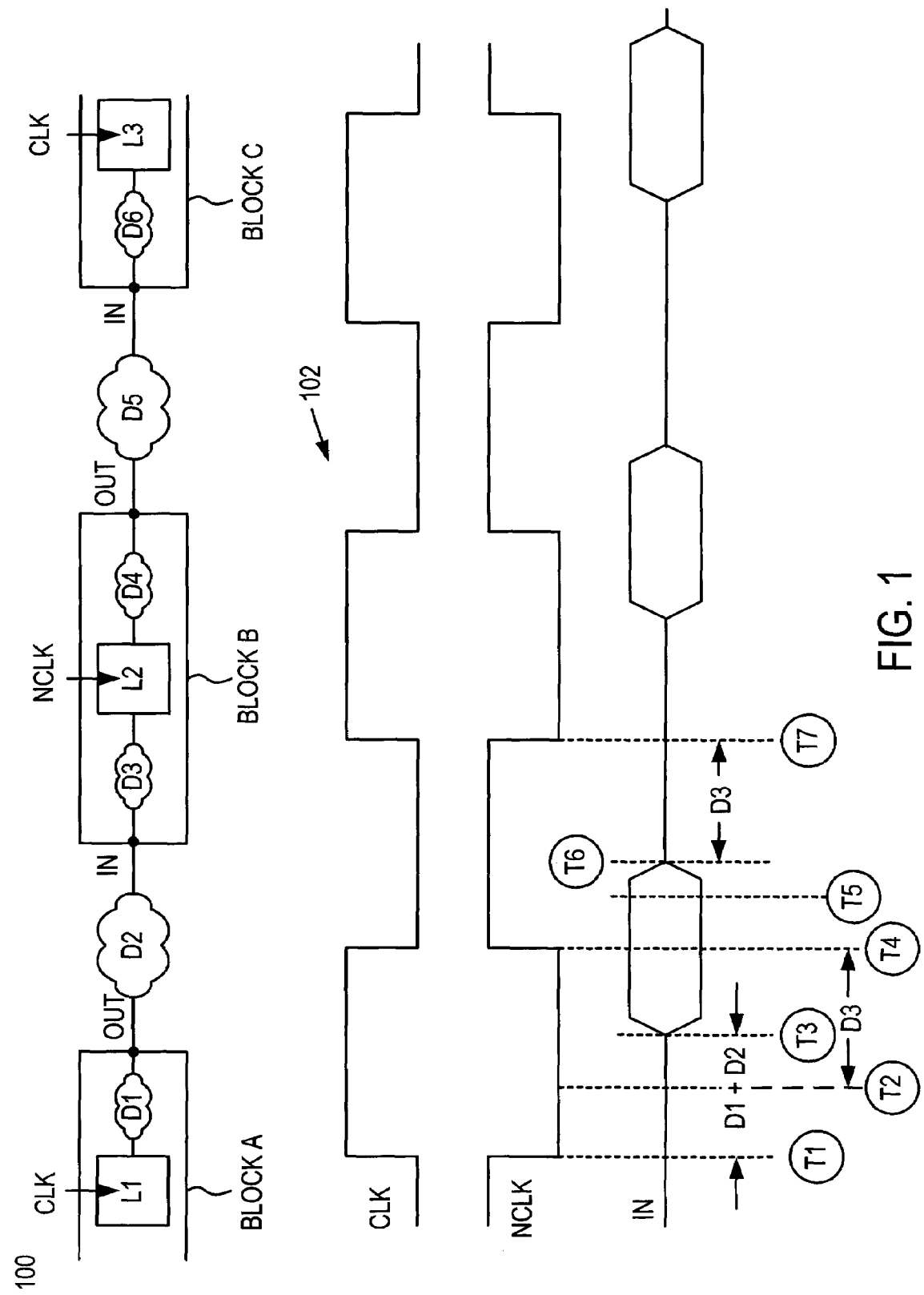
FIG. 1 illustrates a circuit and associated timing graph for illustrating concepts related to slack in accordance with an embodiment of the present invention.

Methods and systems for analyzing timing requirements of circuits, such as integrated circuits, are described herein. In summary, the circuit is portioned into a plurality of blocks wherein each block has an input and an output. The inputs and outputs are sometimes referred to as ports. Each input and output has a timing target or requirement, which is required to be met in order for the circuit as a whole to function properly. The methods and systems described herein perform timing analysis on each port. If a port cannot meet its timing requirements, the methods and systems described herein determine whether the timing requirements can be modified without causing the circuit as a whole to fail.

The systems and methods described herein may be implemented in hardware, software, firmware, or combinations thereof. In some embodiments, the methods and systems are implemented using hardware. The methods and systems can be implemented with one or more of the following well-known hardware technologies: discrete logic circuits that include logic gates for implementing logic functions upon data signals, application specific integrated circuits (ASICs), programmable gate arrays (PGAs), and field-programmable gate arrays (FPGAs).

In other embodiments, the methods described herein may be implemented using a computer, wherein the methods are performed using computer programs, which are read by the computer. Some information specific to a circuit being analyzed may be input into the programs via the computer. For example, the interconnects and the timing requirements may be input into the programs.

The target-based timing analysis methods disclosed herein improve the design convergence time for circuit designs as compared to other methods. These improvements are especially applicable to large full-custom VLSI designs. By supporting the use of targets in the analysis, the target-based timing analysis methods disclosed herein make the design process more predictable and stable as compared to approaches that use changing circuit timing totals.

The target-based timing analysis methods described herein create a separation between local block designs and the higher level chip level design. The chip level design is sometimes referred to as a "global design". In this regard, the target-based timing analysis methods establish interface timing specifications (also referred to hereinafter as "targets") that define agreements between global design and local block design. In one embodiment, the target-based timing analysis methods can be implemented in a fast static timing analysis system (also referred to hereinafter as "target analysis system"). The target analysis system analyzes targets and timing abstraction models to determine if slack, as described below, is available and to determine which targets need to change in order to meet the timing requirements at a particular port.

In summary, the processing described herein determines the maximum amount of time a designer can change the slack at a particular port, referred to as port A. In other words, when a designer adds a circuit upstream of port A, the processing described herein determines the maximum amount of time or delay that can be tolerated by the circuit. It is noted that the maximum amount of time a designer can move the slack at port A is dependent not only on the delays through paths connected to port A, but also on the downstream paths associated with downstream ports. As described in greater detail below, one embodiment modifies the target slack or target leeway of the port based on potential slack of downstream paths.

Slack Terminology

FIG. 1 illustrates a circuit 100 and an associated timing graph 102 that illustrate concepts related to slack. In summary, slack relates to the amount that timing requirements or targets may be changed without causing the circuit 100 to fail. The circuit 100 includes a plurality of blocks, which are referenced as block A, block B, and block C. The blocks may, as an example, be portions of the circuit 100 that are designed by different designers or that are sub-circuits within the circuit 100. Each block includes at least one input port, referenced as IN, and at least one output port, referenced as OUT. In addition, each block includes at least one latch or similar device, wherein each latch is either in a condition that allows data to pass through a block or a condition that blocks the transfer of data through the block. More specifically, when the latch is in a condition to pass data, the data may pass between an input port and an output port. Likewise, when a latch is not in a condition to pass data, the data is prevented from passing from an input port to an output port. It is noted that data is transmitted in the circuit 100 by way of signals.

The latches are referenced as latch 1 or L1, latch 2 or L2, and latch 3 or L3. The condition of each latch is dependent on the state of a clock signal associated with each latch. Referring to the timing diagram 102, two clock signals are depicted, a first clock signal CLK and a second clock signal NCLK. The two clock signals are the inverse of one another. As shown in the circuit 100, the first clock signal CLK is associated with the first latch L1 and the third latch L3. The second clock signal NCLK is associated with the second latch L2. As the clock signals cycle, data is transferred between block A and block C via block B.

Each data path between the ports has a delay associated therewith. Each of the delays are depicted by a cloud in the circuit 100. A first delay D1 is representative of the delay between the first latch L1 and the output port of block A, which is sometimes referenced as port A_OUT. A second delay D2 is representative of the delay between the output port OUT of block A and the input port IN of block B, which is sometimes referred to as port B_IN. A third delay D3 is representative of the delay in block B between the input port IN and the second latch L2. A fourth delay D4 is representative of the delay in block B between the second latch L2 and the output port OUT, which is sometimes referred to as port B_OUT. A fifth delay D5 is representative of the delay between the output port OUT of block B and the input port IN of block C, which is sometimes referred to as port C_IN. A sixth delay D6 is representative of the delay in block C between the input port IN and the third latch L3.

With reference to the timing diagram 102, a time T1 represents the opening edge (or rising edge) of the first clock signal CLK. The rising edge of the first clock signal CLK causes the first latch L1 to open. A time T2 represents the time when a signal arriving at the input port IN of block B becomes transparent at latch L2. A time T3 represents the time at which the signal arrives at input port IN of block B. A time T4 represents the opening edge or rising edge of the second clock signal NCLK. The time T4 also represents the falling edge of the first clock signal CLK. The rising edge of the second clock signal NCLK causes latch L2 to open. A time T5 represents the target time for the input port IN of block B. The target time is sometimes referred to simply as the target and represents the time at which the signal is supposed to arrive at the input port IN of a block. The target times are typically assigned by the designers of the circuit 100. It should be noted that the signal may arrive before the target time. As described in greater detail below, if a signal cannot arrive in time, the systems and methods described herein determine whether the target times may be changed to avoid failure of the circuit 100. A time T6 represents the latest arrival time for the signal at the input port IN of block B before a setup or timing violation occurs. A time T7 represents the closing edge or falling edge of the second clock signal NCLK. The falling edge of the second clock signal NCLK causes latch L2 to close.

The terms "transparency window", "slack", and "target slack" will now be defined. For illustration purposes, they will be defined with regard to the input port IN of block B. Transparency window is herein defined as the time window (defined from time T2 to time T6) in which data or a signal arrives at an input port and transparently passes through to the output. For example, when a signal arrives at the input port IN of block B during a period after time T2 and before time T6, the signal transparently passes through to the output port OUT of block B.

Slack

Slack is herein defined as the difference between the arrival time of the signal at an input port and the latest arrival time of the signal before a set up or timing violation occurs. Accordingly, slack refers to leeway in the timing target associated with a port. With regard to the above-described example, the slack is the difference between time T6 and time T3. The systems and methods described herein calculate slack to determine whether the above-described target times can be changed without causing the circuit to fail.

Target Slack

Target slack is herein defined as the time difference between the arrival time of the signal at an input and the target time. As set forth above, the target time is the time at which the signal is expected to arrive. In the above described example, the target slack is the time difference between time T5 and time T3. It should be noted that a positive target slack means that the signal arrived before its target time and a negative target slack means that the signal arrived late or after its target time.

Target slack may be defined as the amount of slack at a first port relative to a second port. Thus, the target slack accounts for the time at which the signal was output from a port and the delays in transmission to an input port. In the following example, target slack at a first port, port v, is calculated relative to a second port, port p. The target slack relative to port v is referred to as TS(v). If TS(v) is greater than or equal to zero, then the signal arrived on or before its target time. Accordingly, the timing requirements at port p can be met without requiring target time changes to port v.

If, on the other hand, TS(v) is less than zero, target changes are needed at port v before timing requirements at port p can be met. Target slack can be calculated by the following equation:

$$TS(v)=T(v)-(T(p)+D(v,p))$$

where T(v) is the target time at port v, T(p) is the target time at port p, and D(v,p) is the total delay between ports p and v.

Potential Slack

The potential slack represents the maximum available time before circuit failure occurs. More specifically, potential slack is the difference between the time at which a signal arrives at a port and the time at which a timing violation will occur. It is noted that the timing analysis described herein is not specific to a current latch transparency. For example, if a signal arrives at the input of a block prior to any latch transparent paths, previous timing analysis tools stop path tracing and calculate slack. The target analysis methods described herein continue path tracing and calculate the potential slack at each point or port.

Potential slack with respect a port v is referred to as, PS(v), and is defined as the amount of slack available at port p relative to a port v, and assuming port p receives the signal at the latest possible time before a timing violation occurs. If PS(v)>=0, the timing target at port p can be adjusted without causing timing failures. If PS(v)<0, the current implementation of the design cannot meet the target requirements at port p. Potential slack may be calculated by the following equation:

$$PS(v)=L(v)-(T(p)+D(v,p))$$

where L(v) is the latest possible signal arrival time of a signal at port v before a timing violation occurs, T(p) is the target time at port p, and D(v,p) is the total delay between port p and port v.

Embodiments of the methods and systems described herein are directed to managing timing constraints using targets and target slack. Embodiments of the methods and systems described herein perform a target slack determination or calculation and further perform assessments as to whether or not the blocks that need target changes have available slack by using a potential slack calculation. Furthermore, embodiments of the methods and systems described herein can determine the maximum available slack for a port of interest, such as a port that is currently being analyzed.

Target Analysis Processing

Figure 2:
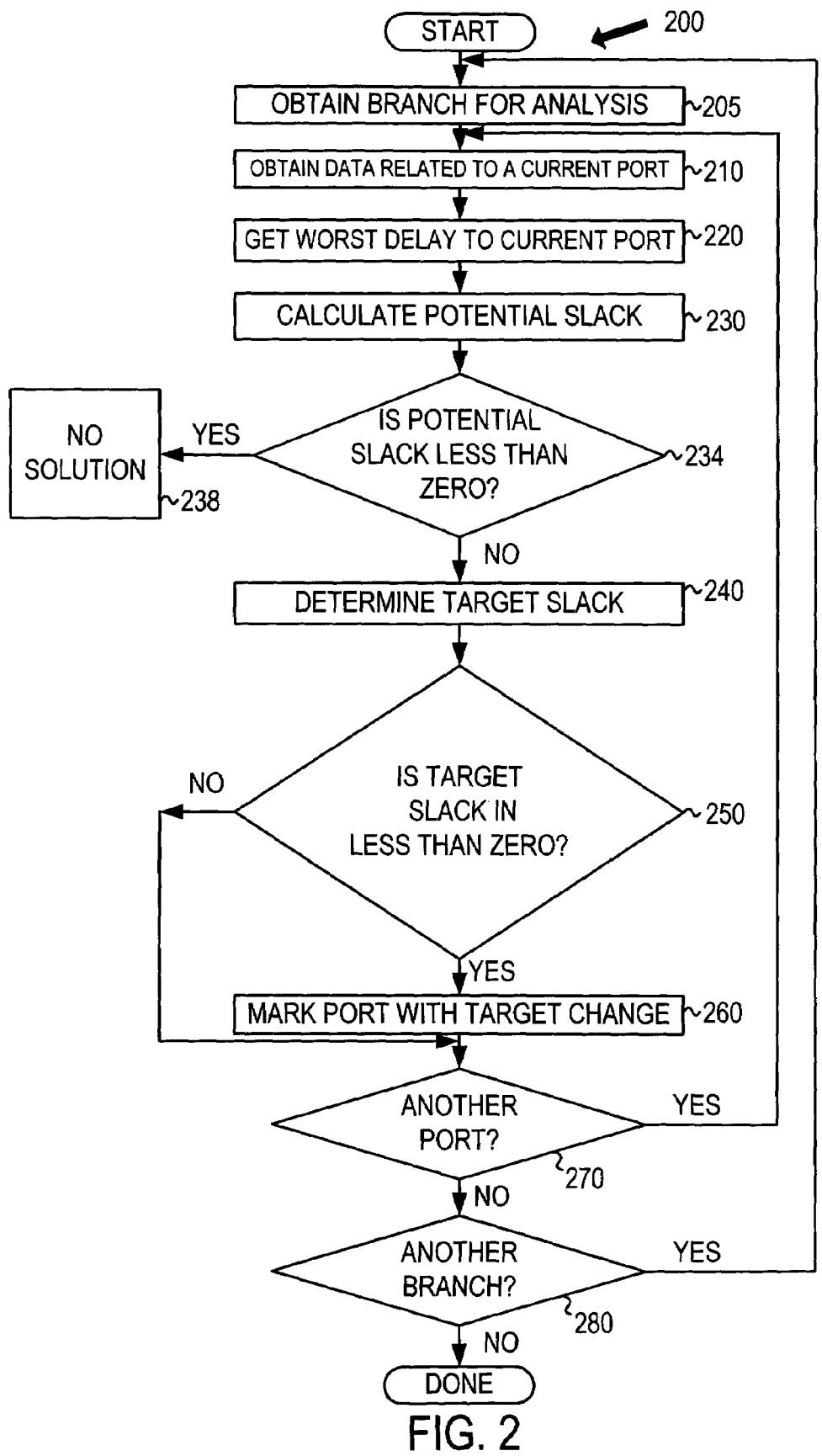
FIG. 2 is a flow chart illustrating the steps performed by the target analysis method in accordance with an embodiment of the invention.

FIG. 2 is a flow chart 200 illustrating the steps performed by an embodiment of the target analysis method. At step 205 a branch portion of the circuit is obtained for analysis. More specifically, data representative of a branch is obtained. A branch is a portion of a circuit and may include a plurality of blocks and the data paths connecting the blocks together. In step 210, performance data related to a node or port is obtained. It is noted that the port may be any node in the branch. This port is sometimes referred to as the current port. The performance data may include timing targets and the like. In step 220, the worst delay to the current port is obtained. The worst delay is the latest possible time in which a signal may arrive at a port before a timing violation occurs.

In step 230, the potential slack between the current port and a second node, such as a second port, is calculated. In decision block 234, a determination is made as to whether the potential slack is less than zero. In another embodiment, a decision may be made as to whether the potential slack is in a predetermined relationship with a predetermined number. In the example described herein, if the potential slack is less than zero, processing proceeds to step 238. Step 238 indicates that no solution is available because the signal cannot arrive at the current port before a timing violation occurs. In one embodiment, a user is notified that no solution exists for this situation. If the potential slack is not in a predetermined relationship with a predetermined number, such as when the potential slack is not less than zero, processing proceeds to step 240.

In step 240, the target slack of the current port is calculated. In decision block 250, a determination is made as to whether the target slack is less than zero. When the target slack is greater than zero, no target adjustment is necessary on this port and processing proceeds to step 270. It should be noted that the target slack may be compared to any predetermined number. The embodiment of the flow chart of FIG. 2 uses a predetermined number of zero. As set forth above, a positive target slack indicates that the signal will arrive before the target time.

When the target slack calculated in step 240 is less zero, the timing target cannot be accomplished. In such a situation, the port or software representative of the port is marked with a change to the timing target as indicated in step 260. More specifically, the computer program or the like that is analyzing the circuit 100, FIG. 1, notes that a change in the target timing at the current port is required. The process of calculating a different timing target is described in greater detail below. If the result of the decision block 250 is negative, the tracing branch is stopped and the analysis continues to block 270.

In decision block 270, it is determined whether there is another port or node to process. When there is another port to process, processing proceeds to step 210. Otherwise, when there are no other ports to process, a determination is made in determination block 280 whether there are other branches to process. When there are further branches to process, the processing proceeds to step 205. Otherwise, when there are no other branches to process, this portion of the processing is completed. At this time, the timing targets that cannot be accomplished are known. As described in greater detail below, the targets may be changed so that the circuit operates without timing violations.

Figure 3:
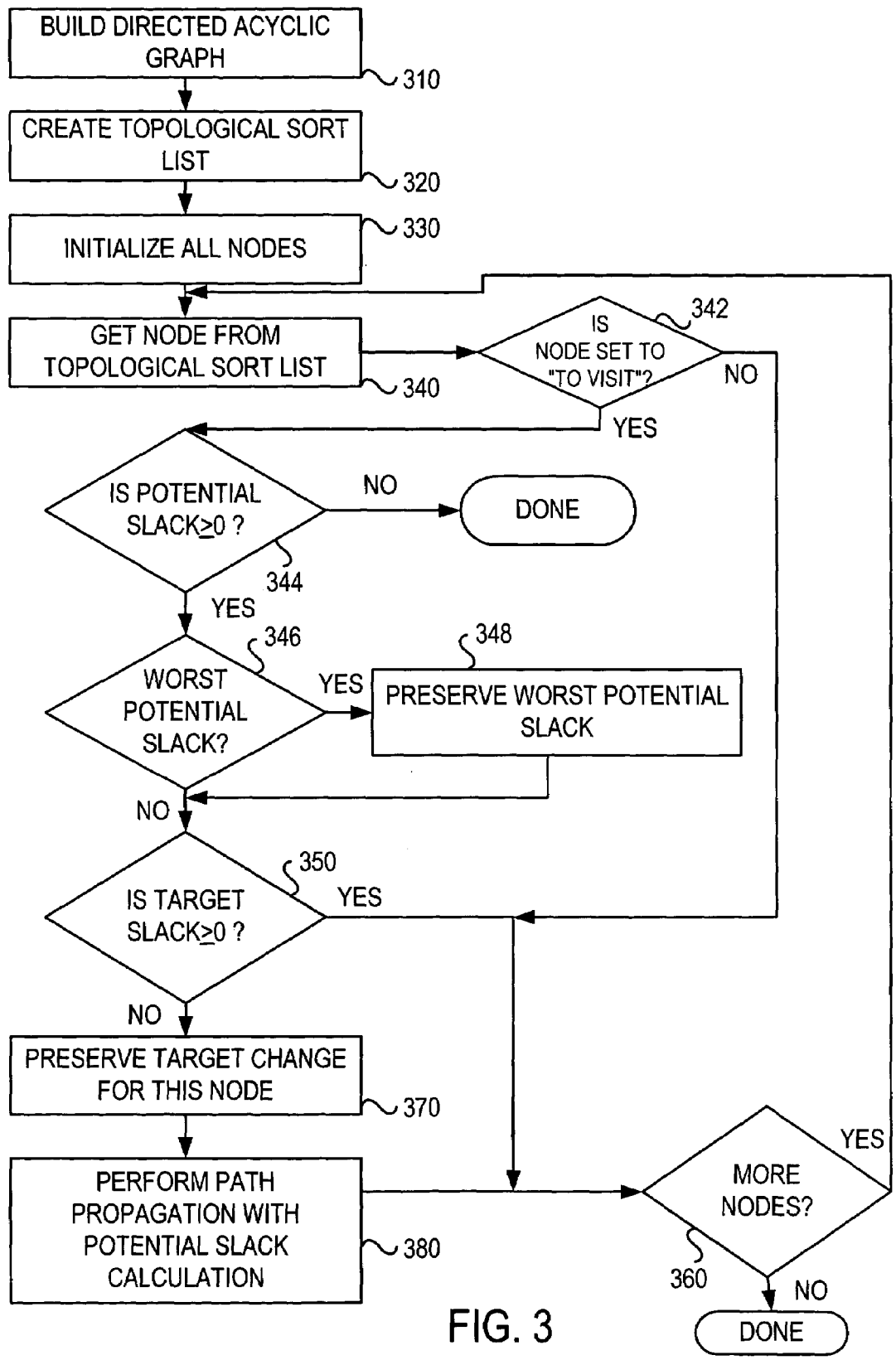
FIG. 3 is a flow chart illustrating the steps performed by the target analysis method in accordance with an embodiment of the invention.

FIG. 3 is a flow chart illustrating the steps performed by the target analysis method in accordance with another embodiment systems and methods described herein. The embodiment of the target analysis of FIG. 3 does not include any circuit traversal details.

In step 310, a weighted directed acyclic graph representative of the circuit being analyzed is generated or constructed. The weighted directed acyclic graph represents the circuit connectivity. The weighting of the edges represents delays between graph nodes. The nodes of the graph may represent ports of the circuit being analyzed.

In step 320, a topological sort list of the directed acyclic graph is created. For example, the topological sort list may include a plurality of nodes that are ordered in path trace order. The topological sort list of the graph is created to set up path tracing. The topological sort list of the graph also ensures that no node is processed before any node that drives the node that is to be processed. In one embodiment, the topological sort list of the graph is generated by using a depth-first search algorithm, which is known by those of ordinary skill in the art. In another embodiment, the topological sort list of the graph is generated by using a breadth-first search algorithm, which is also known by those of ordinary skill in the art.

In step 330, the plurality of nodes for the branch being analyzed are initiated to a state that indicates a non-visited or "to visit" status for each node. The non-visited or "to visit" status indicates that the nodes have not been analyzed. It should be noted that several other indications may be used to indicate that the nodes have not been visited or otherwise analyzed. As set forth below, path tracing is performed by visiting each graph node in topographical order. In step 340, a next graph node is retrieved or obtained from the topological sort list. If there are no more nodes to be analyzed, the action of step 330 commences the analysis.

In decision block 342, a determination is made whether the visit status of a node being analyzed is set to "to visit." When the visit status of the node is set to "to visit," processing continues to decision block 344. Otherwise, when the visit status of the node is not set to a designation indicating that it has been analyzed or not "to visit," processing proceeds to decision block 360. For example, the node may be set to a status such as "visited" or "do not visit." It should be noted several indications may be applied to the node which indicate that analysis is complete or that otherwise indicate "visited" or "do not visit."

Part of the following analysis commencing at step 344 determines the worst value of potential slack. The worst value of potential slack represents the smallest non-negative amount of potential slack calculated for a specific path. The "worst" value of potential slack is initially set to the potential slack of the first node. Subsequent nodes are then compared to the stored "worst" value to determine if the potential slack of a subsequent node is smaller than the currently stored 'worst' potential slack. When the potential slack of a subsequent node is smaller than the currently stored "worst" potential slack, the potential slack of that node becomes the "worst." This worst or lowest value of potential slack indicates the amount that timing targets in a branch may be changed before a timing violation occurs.

The worst potential slack of a branch may be stored or otherwise preserved. The worst potential slack value indicates the maximum amount the target could potentially be changed without causing a timing error. For example a timing failure at a first port or node may be able to be fixed as described herein by the target slack calculation. The potential slack can be used to understand how much further the target of the first port target can be adjusted. Thus, the worst potential slack provides a base line for the adjustment throughout the branch.

Referring again to FIG. 3, in decision block 344, a determination is made as to whether the potential slack at the current node is greater than or equal to zero. As set forth above, in other embodiments, the potential slack may be compared to other numbers. If the potential slack is greater than or equal to zero, the required slack has been found. In other words, there is enough slack in the timing requirements for the circuit to function. If, on the other hand, the potential slack is less than zero, the required slack has not been found and the analysis is complete because the circuit will not function without timing violations. If the potential slack is greater than or equal to zero, the analysis continues to decision block 346. In decision block 346 a determination is made as to whether the potential slack is the worst potential slack. This may involve comparing the potential slack to other potential slacks to determine if the present potential slack is the smallest positive value. If the potential slack is the worst potential slack, processing proceeds to step 348 where the potential slack for the node is preserved or otherwise stored. When the potential slack is not the worst potential slack, processing continues directly to decision block 350.

In step 350, the target slack is compared to a predetermined number, which in this embodiment is zero. Thus, a determination is made as to whether the required target slack exists at the current node. As described above, in the examples described herein, the required target slack is a target slack that is greater than or equal to zero. When the target slack of the node is positive, the timing target of the current node does not need to change for a solution to be found. Processing then continues to decision block 360 to determine whether more nodes are required to be analyzed.

As briefly set forth above, when the required target slack has been found, processing proceeds to step 360, where a determination is made as to whether there are more nodes in the graph that are required to be analyzed. When there are more nodes to process, the processing returns to step 340. Otherwise, the processing is complete.

When the target slack of the node is negative, the required slack has not been found and processing proceeds to step 370. In other words, the signal will arrive after the timing requirement. Because the potential slack is positive, the signal will arrive before a timing violation occurs. At step 370, the data related to the node and the target slack are preserved or otherwise saved because the timing target of the port associated with the node needs to be changed for a solution to be found.

In step 380, path propagation using the above-described potential slack calculation is performed. An example of path propagation is described in greater detail below. For example, the worst case target slack from the current node is calculated, and the potential slack is also calculated. Processing then proceeds to decision block 360 where a determination is made as to whether there are more nodes to process.

Worst-Case Target Slack Processing

Figure 4:
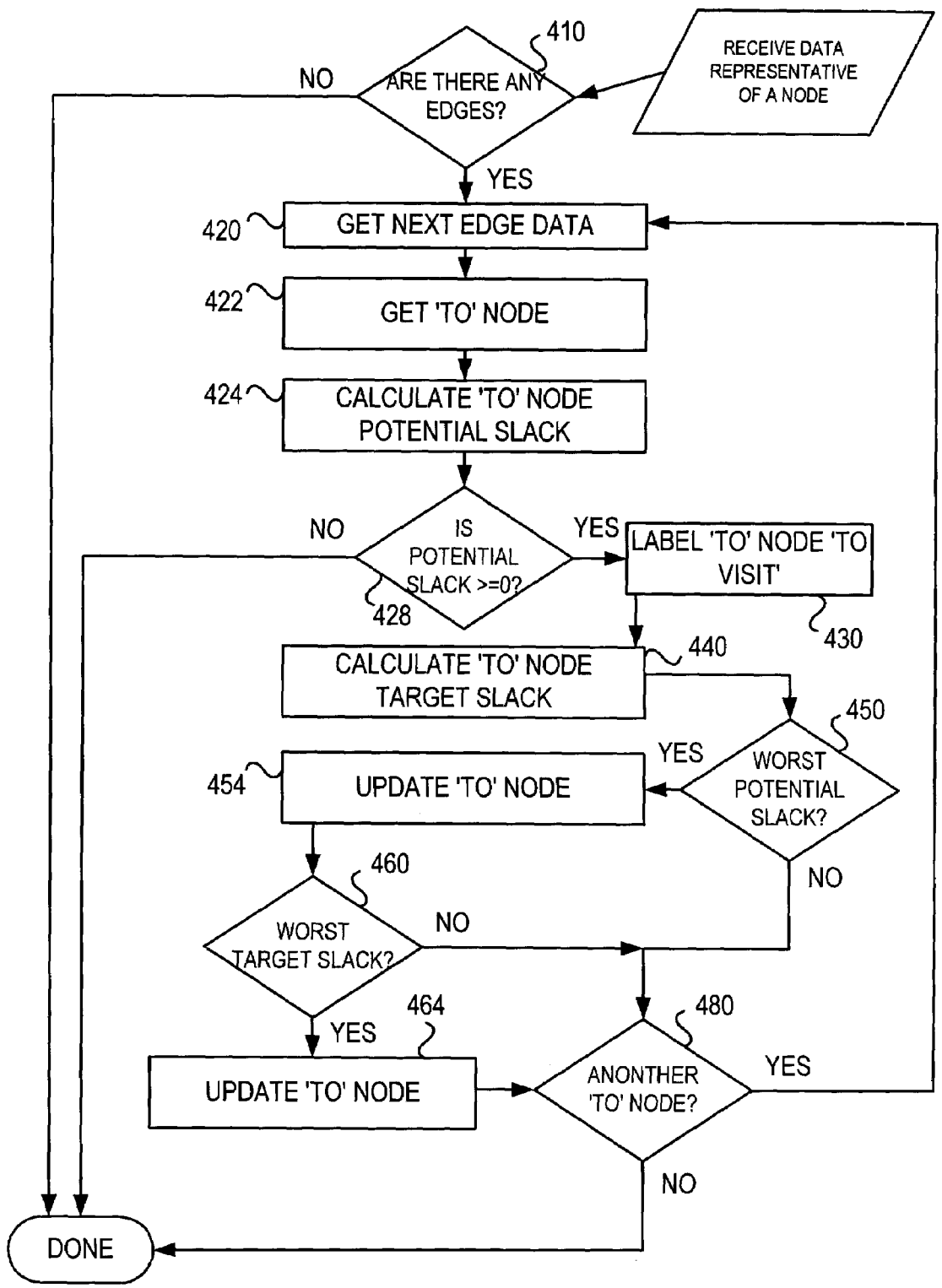
FIG. 4 is a flow chart illustrating in greater detail the target slack based relaxation step of FIG. 3 in accordance with an embodiment of the invention.

FIG. 4 is a flow chart illustrating in an embodiment the target slack based relaxation step 380 of FIG. 3. The worst case target slack processing method verifies that the current graph node is set to a state indicating that some nodes in the graph may not require visitation or further analysis as solutions are found. In this embodiment, an indication of "to be visited" is used in order to identify such nodes. It is noted that other indications may be used.

In summary all adjacent nodes, which are sometimes referred to as "TO" nodes, are visited or otherwise analyzed, and their potential slacks are calculated. The results indicate the maximum amount of slack that is available due to timing characteristics of the current graph node. A negative potential slack indicates a circuit problem. In such a circumstance, the target analysis is unable to find available slack and the timing targets cannot be reconfigured to overcome a timing violation. If the potential slack is positive, the target slack is calculated. The data associated with the node (which is an adjacent node) is then updated if either the target slack or potential slack are worse than previously stored values.

In the following example, a node represents a port of a design block and an edge represents the circuit delay realized between two nodes. In step 405, data representative of a node is received for processing. In decision block 410 a determination is made whether there are any edges, or delays, associated with the current node. If there are no edges at the current node, processing is completed because there are no delays. When there are edges or delays at the current node, a next edge, or data representative thereof, is retrieved as shown in step 420.

In step 422, data representative of a TO or adjacent node is retrieved. It is noted that the adjacent nodes are along the path in which a signal propagates. An indication that analysis is required is provided or otherwise attached to the data representative of the node. In step 424, the potential slack of the TO node is calculated. In decision block 428, a determination is made as to whether the potential slack is in a predetermined relationship with a predetermined value. In the example of FIG. 4, the determination is whether the potential slack is greater than or equal to zero. Thus, in the example of FIG. 4, the predetermined value is zero and the predetermined relationship is greater than or equal to zero. In the example of FIG. 4, processing is complete when the potential slack is less than zero, which means no timing violation will occur at the present node.

If the potential slack is greater than or equal to zero, the adjacent or TO node is labeled with an indication that further processing is required as shown in step 430. The indication may, as an example, provide a TO VISIT label at the adjacent or TO node. In step 440, the target slack of the adjacent or TO node is calculated.

In decision block 450, a determination is made as to whether the potential slack of the TO node is the worst potential slack calculated. If the potential slack is not the worst potential slack, the processing continues to decision block 480 where another node is processed. If the potential slack is the worst potential slack, the data associated with the adjacent or TO node is updated in step 454. As described above, the worst potential slack is calculated by taking the minimum potential slack of all the potential slack calculated in a path. Processing proceeds from step 454 to decision block 460.

In decision block 460, a determination is made whether the target slack is the worst target slack. When the target slack is the worst target slack, the data associated with the TO node is updated as shown in step 464. Similar to worst potential slack, the worst target slack is the smallest target slack in the path. Processing then proceeds to step 480. If the target slack is not the worst target slack, processing proceeds directly to 480. In decision block 480, a determination is made whether there is another TO node to process. When there is another TO node to process, processing proceeds to step 420. Otherwise, when there are no more TO nodes to process, the processing is complete.

Circuit Analysis Example

Figure 5:
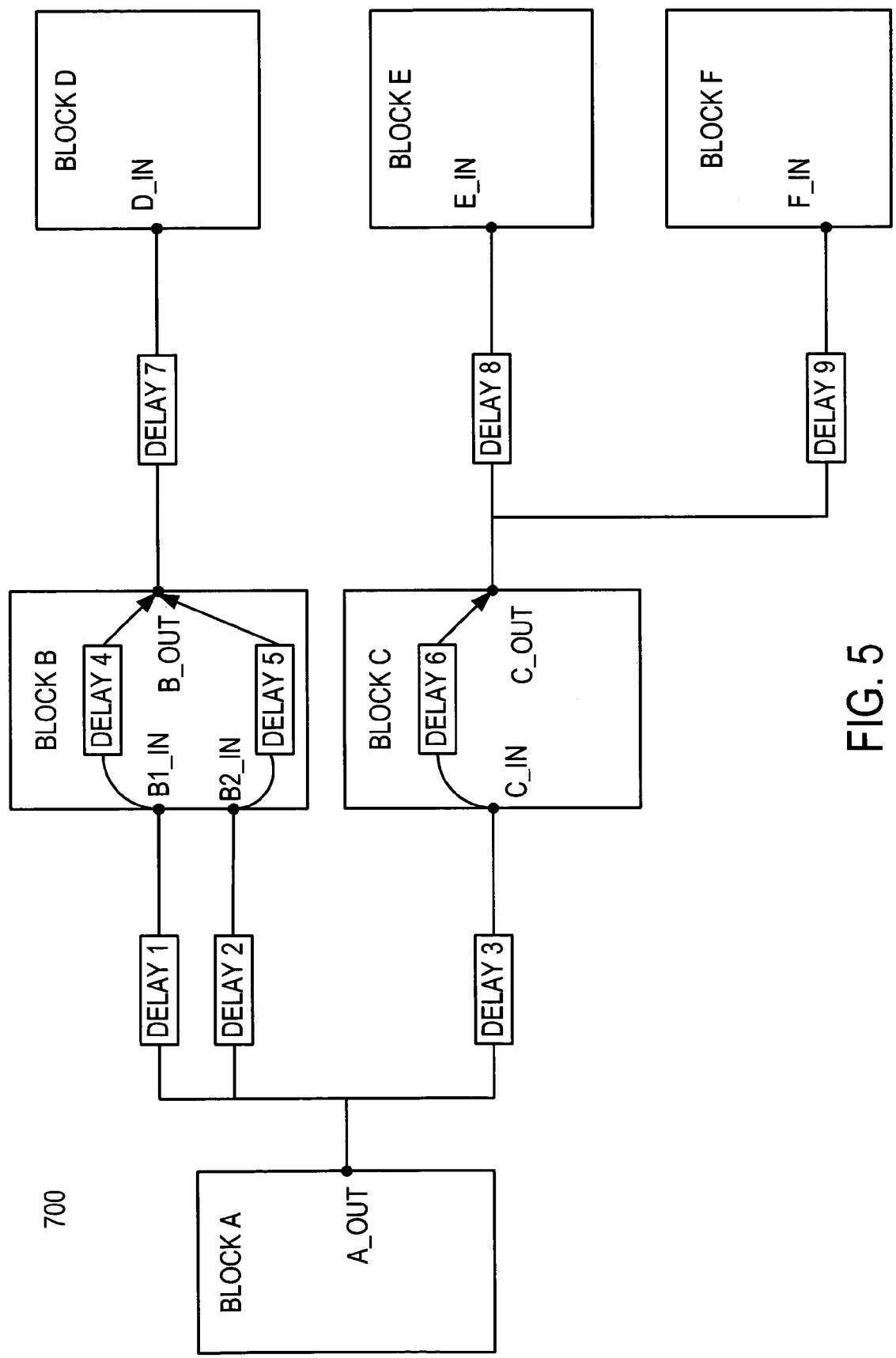
FIG. 5 illustrates an exemplary circuit design that includes six blocks that can be analyzed by the timing analysis method according to an embodiment of the invention.
Figure 6:
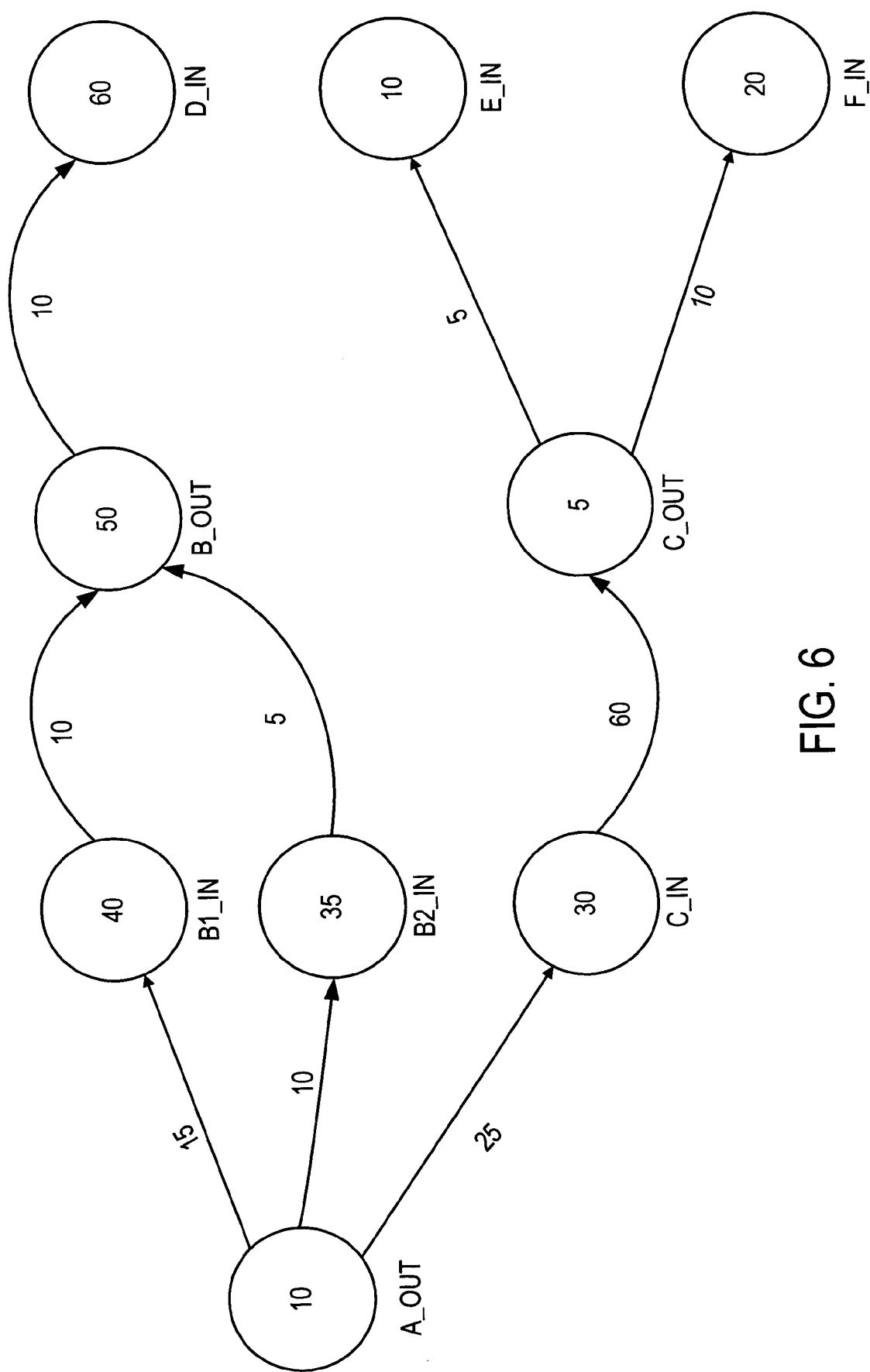
FIG. 6 is an exemplary graph representation of the circuit design of FIG. 5 in accordance with an embodiment of the invention.

FIG. 5 illustrates an exemplary circuit 700 that includes six blocks that can be analyzed by an embodiment of the timing analysis method described herein. FIG. 6 is a graph or nodal diagram of the circuit 700 of FIG. 5. The exemplary circuit 700 represents a top-level design that includes a plurality of blocks. The blocks are designated as block A, block B, block C, block D, block E, and block F. The blocks may be designed by different designers or design groups.

Each block of the circuit 700 has at least one port associated therewith. Each port in turn has a timing target or requirement associated therewith. An example of the timing targets are shown in FIGS. 6 and 7. The timing targets shown in FIGS. 6 and 7 are normalized and may, as an example be nanoseconds. The delays described herein are sometimes referred to as delay units, which may be normalized units. Block A has an output port, which is designated as port A, and which has a timing target designated as port A_OUT. The value of the timing target for port A_OUT is ten. Block B has two input ports designated as B1 and B2. The timing target of port B1 is designated as port B1_IN and, per FIG. 7, has a value of forty. The timing target of port B2 is designated as port B2_IN and, per FIG. 7 has a value of thirty-five. The remaining ports and timing targets associated with the blocks of FIG. 5 are shown in FIGS. 5, 6, and 7.

The paths between the blocks and through the blocks also have delays. For example, a delay one exists between port A and port B1. A delay, designated as delay four, exists between, port B1 and the output port of block B and is representative of the delay through block B between the ports. An example of path delay values is provided in FIGS. 6 and 8. Per FIG. 8, the delay one may have a value of fifteen and the delay four may have a value of ten. In addition to exemplary delay values, FIG. 8 also includes exemplary numbers of clock cycles associated with the delays. For example. delay six, which is the delay between the input and output of block C, requires two clock cycles.

Having described the exemplary circuit 700 of FIG. 5 and exemplary values associated therewith, a timing analysis based on some of the above-described methods will now be described.

In one example of the design of the circuit 700, the designer of block A cannot meet the timing requirement or target imposed on port A_OUT. The target-based timing analysis methods described herein determine whether there are opportunities to adjust the timing targets of other block ports to relax the constraints on port A_OUT of block A. Furthermore, the target-based timing analysis methods described herein can identify which target changes are needed so that port A_OUT can meet the timing requirement imposed thereon. For example, the target-based timing analysis methods described herein can determine whether ports B_IN and C_IN have slack. If so, there is a possibility that the target-based timing analysis methods may be utilized to adjust the targets of ports B_IN and C_IN to help port A_OUT to meet its timing requirement.

An example of calculating target slack and using target slack to meet timing requirements is described below in reference to FIGS. 5-9. The design block in FIG. 5 can be represented as a graph, which may be referred to as G(V,E), where V represents the set of instance ports (e.g., A_OUT, B_IN), and E represents the set of delay paths between the instance ports. A port p defines the starting point for the analysis. During path analysis, a quantitative assessment of the analysis is performed at each visited instance port V. This assessment is referred to herein as "target slack." The graph of FIG. 5 can be generated based on the information in FIGS. 7–9, which is described in greater detail hereinafter. FIG. 7 sets forth the timing requirements or targets at each port of the circuit of FIG. 5. FIG. 8 sets forth the current delay and the number of clock cycles required by the each delay path of FIGS. 5 and 6. FIG. 9 sets forth the latest allowable signal arrival time at each port of FIG. 5.

In one example described herein, port A_OUT is failing its timing requirement by 11 delay units. In other words, the designers of block A cannot meet the timing requirement imposed on port A_OUT. As shown in FIG. 7, port A_OUT has a target of 10 delay units into the clock cycle. The target at port A_OUT needs to change its target by the amount in which it cannot be met. As set forth above, the timing requirement at port A_OUT is missed by eleven delay units. Therefore, the timing requirement of port A_OUT needs to be increased by eleven delay units. Accordingly, the timing requirement of port A_OUT needs to be changed from ten delay units to twenty-one delay units.

At this point in the analysis, the timing requirement or target of port A_OUT has been changed from ten to twenty-one delay units. The analysis continues by examining the target slack at port B1_IN, which is referenced as TS(B1_IN). As described above, the target slack indicates whether there is enough slack between the time a signal arrives and the targeted signal arrival time to move the targeted signal arrival time. The target slack TS(B1_IN) is equal to the timing target at port B1_IN minus the sum of the timing target of port A_OUT and the delay between port A_OUT and port B1_IN. As set forth in the chart of FIG. 7, the timing target at port B1_IN is forty delay units and, per FIG. 8, the path delay between port A_OUT and port B1_IN is fifteen delay units. Thus, TS(B1_IN)=40−(21+15)=4 delay units. As set forth, the target slack at port B1_IN is positive, which indicates that the timing target at port A_OUT can be increased by the required eleven delay units without requiring a change to the timing requirements at port B1_IN. Furthermore, there is no need to trace forward in the branch beyond B1_IN since a solution has been found for this branch of logic.

Having established that increasing the timing target of port A_OUT by eleven delay units works with port B1_IN, the analysis continues to analyzing port B2_IN. The analysis of B2_IN, commences by calculating the target slack is TS(B2_IN), which is equal to the timing target of thirty-five delay units per FIG. 7 minus the sum of the timing target of port A_OUT and the delay between port A_OUT and B2_IN. The timing target of port A_OUT has been increased, as described above, to twenty-one delay units. The delay between port A_OUT and B2_IN is ten delay units per the chart of FIG. 8. Thus, TS(B2_IN)=35−(21+10)= 4. Because the target slack at port B2_IN is positive, the timing target at port A_OUT can be increased as described above without causing timing problems at port B2_IN. Similar to the case with B1_IN, there is no need to trace forward beyond B2_IN because a solution has been found for this branch of logic.

At this point in the analysis, it has been determined that the increase in the timing target at port A_OUT can be tolerated at both ports B1_IN and B2_IN. The analysis continues by analyzing the effect of the increase target timing on port C_IN. The analysis commences by calculating the target slack, TS(C_IN), as was done with the ports on block B. The target slack TS(C_IN) is equal to the timing target of thirty minus the sum of the increased timing target of port A_OUT of twenty-one delay units and the delay between port A_OUT and port C_IN of twenty-five delay units. Thus, the target slack TS(C_IN)=30−(21+25)=−16. Unlike the previously calculated target slacks, the target slack at port C_IN is negative. This negative result means that the timing target at port C_IN must be increased by sixteen delay units if the timing target at port A_OUT is increased by eleven delay units. However, adjusting the timing requirement at port C_IN will only solve the problem if the potential slack at port C_IN is positive.

Based on the foregoing, the analysis continues by calculating the potential slack at port C_IN, which is sometimes referred to as PS(C_IN). The potential slack at port PS(C_IN) is equal to the latest allowable signal time minus the sum of the timing target at port A_OUT and the delay between port A_OUT and port C_IN. As set forth in the chart of FIG. 9, the latest allowable signal time at port C_IN is thirty-three delay units. As set forth above, the timing target at port A_OUT has been changed from ten delay units to twenty-one delay units. Per FIGS. 6 and 8, the delay between port A_OUT and port C_IN is twenty-five delay units. Therefore, PS(C_IN)=33−(21+25)=−13.

The analysis of the potential slack at port PS(C_IN) is negative, which indicates that it is not possible to fix the timing target at port A_OUT by changing the timing target at port C_IN as described above. In other words, if the timing target at port C_IN were adjusted by the needed 16 delay units, block C would contain a timing violation.

The target-based timing analysis method and system according to the invention aids a designer to understand if a solution exists to a timing problem and what changes need to be made to fix the timing problem and to manage targets. It is noted that an advantage of the target-based timing analysis method and system according to the invention is the insensitivity to broken circuits that do not meet targeted operation. Because targets are used instead of a current operation of other circuits, a valid assessment can be made that was not possible previously with prior art approaches.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A method of analyzing a circuit, said circuit comprising at least two nodes, each of said at least two nodes have timing requirements associated therewith, said method comprising:

receiving a failure time of first node, wherein said failure time represents the time within which a signal must arrive at said first node from said second node in order to avoid a timing violation of said circuit, said second node being upstream of said first node;

determining a potential slack for said first node based on said failure time of said first node, wherein said potential slack is equal to said failure time minus the sum of a target time and the delay between said first node and said second node;

terminating said analysis if said potential slack is less than a first predetermined value;

determining the target slack at said first node, wherein said target slack is equal to said timing requirement of said first node minus the sum of said timing requirement of said second node and the delay between said first node and said second node; and changing the timing requirement of said first node if said target slack is less than a second predetermined value.

2. The method of claim 1 and further comprising recalculating said potential slack if said timing requirement is changed and terminating said analysis if said potential slack is less than said first predetermined value.

3. The method of claim 1, wherein a plurality of nodes exist downstream from said first node, and further comprising determining potential slack and target slack for said plurality of nodes.

4. The method of claim 3, wherein said analysis is terminated if said potential slack is less than said first predetermined value.

5. The method of claim 3, and further comprising determining whether said potential slack at one of said plurality of nodes is the lowest value for all the nodes analyzed, and determining timing requirement changes based on said lowest value of potential slack.

6. The method of claim 1, wherein said first predetermined value is zero.

7. The method of claim 1, wherein said second predetermined value is zero.

8. A method of analyzing a circuit, said circuit comprising at least one circuit block and a plurality of nodes, said method comprising:
creating a directed acyclic graph representative of said circuit;
creating a topological sort list from said directed acyclic graph that includes said plurality of nodes;
initializing the plurality of nodes to indicate that they have not been analyzed, wherein said analyzing comprises determining target slack and potential slack at said nodes;
obtaining data representative of timing requirements associated with a first node from said topological sort list;
changing said timing requirements associated with said first node;
determining whether said first node has been analyzed;
analyzing said first node if said first node has not been analyzed, the analyzing comprising:
determining a potential slack of said first node, wherein said potential slack is equal to a failure time associated with said first node minus the sum of a target time associated with said first node and the delay between said first node and a second node, said second node being upstream of said first node;
terminating said analyzing if said potential slack is less than a preselected value; and
determining the target slack at said first node, wherein said target slack is equal to said timing requirements of said first node minus the sum of said timing requirement of said second node and the delay between said first node and said second node;
saving said change to a timing target if said target slack is less than a predetermined value.

9. The method of claim 8, and further comprising recalculating said potential slack if said timing requirement is changed and terminating said analysis if said potential slack is less than said first predetermined value.

10. The method of claim 8, and further comprising indicating that said first node has been analyzed.

11. The method of claim 8, and further comprising determining whether a third node has been analyzed and analyzing said third node if said third node has not been analyzed.

12. The method of claim 8, wherein said first predetermined value is zero.

13. The method of claim 8, wherein said second predetermined value is zero.

14. An apparatus for analyzing a circuit, said circuit comprising at least two nodes, wherein each of said at least two nodes have timing requirements associated therewith, said apparatus comprising:
at least one computer readable medium; and
computer readable program code stored on said at least one computer readable medium, said computer readable program code comprising instructions for:
receiving a failure time of first node, wherein said failure time represents the time within which a signal must arrive at said first node from said second node in order to avoid a timing violation of said circuit, said second node being upstream of said first node;
determining a potential slack for said first node based on said failure time of said first node, wherein said potential slack is equal to said failure time minus the sum of a target time and the delay between said first node and said second node;
terminating said analysis if said potential slack is less than a first predetermined value;
determineing the target slack at said first node, wherein said target slack is equal to said timing requirement of said first node minus the sum of said timing requirement of said second node and the delay between said first node and said second node; and
changing the timing requirement of said first node if said target slack is less than a second predetermined value.

15. The apparatus of claim 14, wherein said computer readable program code further comprises instructions for recalculating said potential slack if said timing requirement is changed and terminating said analysis if said potential slack is less than a first predetermined value.

16. The apparatus of claim 14, wherein a plurality of nodes exist downstream from said first node, and wherein said computer readable program code further comprises instructions for determining potential slack and target slack for said plurality of nodes.

17. The apparatus of claim 16, wherein said computer readable program code further comprises instructions terminating said analysis if said potential slack is less than said first predetermined value.

18. The apparatus of claim 16, said computer readable program code further comprises instructions for determining whether said potential slack at one of said plurality of nodes is the lowest value for all the nodes analyzed, and determining timing requirement changes based on said lowest value of potential slack.

19. The apparatus of claim 14, wherein said first predetermined value is zero.

20. The apparatus of claim 14, wherein said second predetermined value is zero.

* * * * *